(12) United States Patent
Asano

(10) Patent No.: US 8,970,821 B2
(45) Date of Patent: Mar. 3, 2015

(54) POSITIONING APPARATUS, EXPOSURE APPARATUS AND DEVICE MANUFACTURING METHOD

(75) Inventor: Tosiya Asano, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 325 days.

(21) Appl. No.: 13/478,916

(22) Filed: May 23, 2012

(65) Prior Publication Data

US 2012/0307228 A1 Dec. 6, 2012

(30) Foreign Application Priority Data

Jun. 1, 2011 (JP) ................... 2011-123584

(51) Int. Cl.
*G03B 27/58* (2006.01)
*G03F 7/20* (2006.01)
*G05D 3/12* (2006.01)

(52) U.S. Cl.
CPC .............. *G03F 7/70725* (2013.01); *G05D 3/12* (2013.01)
USPC ......................................................... 355/72

(58) Field of Classification Search
CPC ..... G03F 7/70725; G03F 7/709; G03F 7/707; G03F 7/70758; G03F 7/70775; G03F 7/70816
USPC ....................................................... 355/72, 77
See application file for complete search history.

(56) References Cited

U.S. PATENT DOCUMENTS

| | | | |
|---|---|---|---|
| 2003/0164931 A1* | 9/2003 | Galburt et al. | 355/53 |
| 2003/0217694 A1 | 11/2003 | Korenaga | |
| 2008/0218717 A1* | 9/2008 | Streefkerk et al. | 355/53 |

FOREIGN PATENT DOCUMENTS

JP 4-323759 B2 9/2009

* cited by examiner

*Primary Examiner* — Peter B Kim
*Assistant Examiner* — Michelle Iacoletti
(74) *Attorney, Agent, or Firm* — Rossi, Kimms & McDowell LLP

(57) ABSTRACT

A positioning apparatus includes a stage, a base, a supporting mechanism which is arranged between the stage and the base and supports the stage with a supporting portion having a spring characteristic, an actuator which is arranged between the stage and the base so as to drive the stage, and a controller which controls the actuator so as to reduce a position error of the stage relative to a target position and cancel at least part of a force acting on the stage due to the spring characteristic of the supporting portion, based on the position error of the stage and a variation of a relative position between the stage and the base.

6 Claims, 5 Drawing Sheets

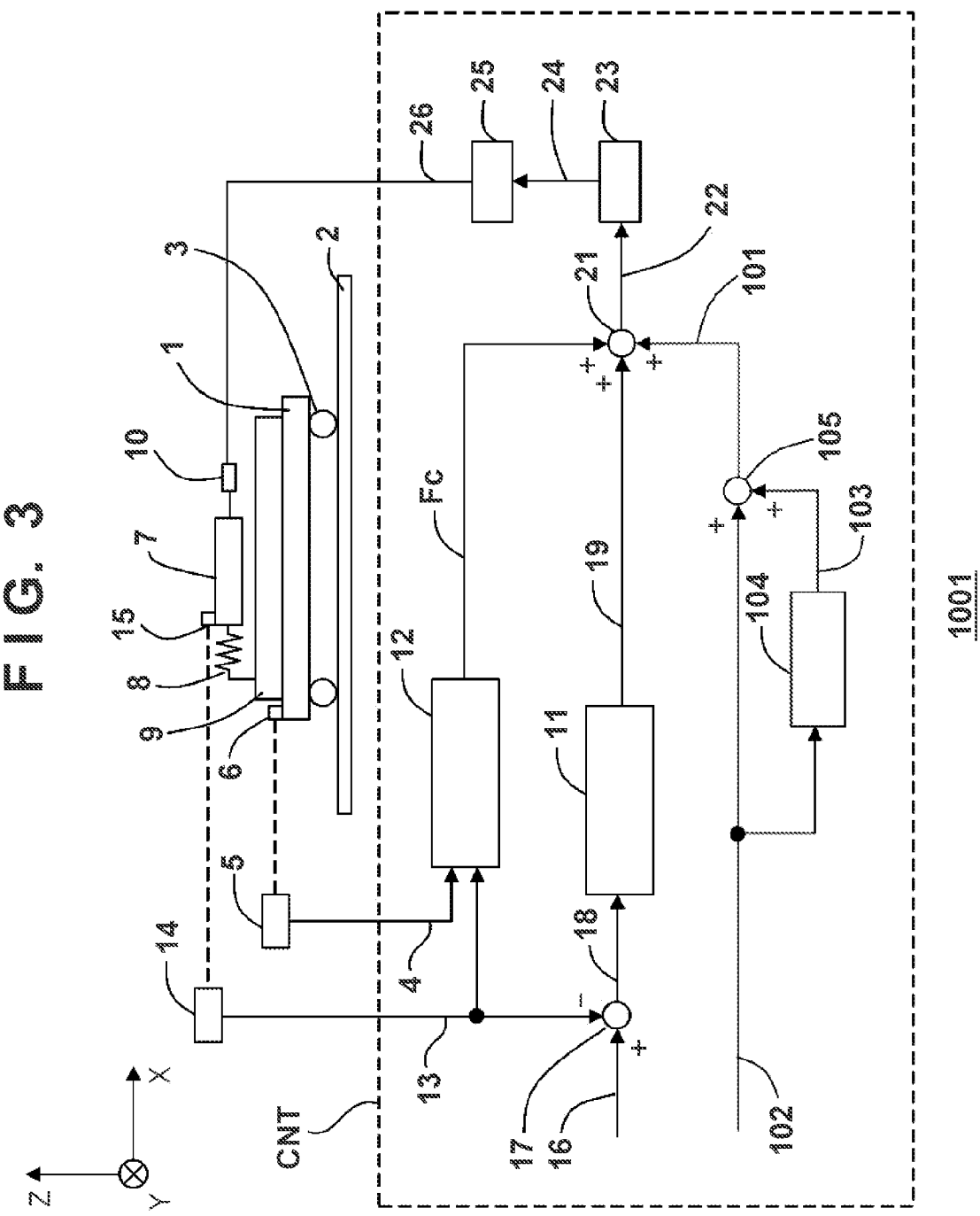

POSITIONING APPARATUS, EXPOSURE APPARATUS AND DEVICE MANUFACTURING METHOD

BACKGROUND OF THE INVENTION

1. Field of the Invention

The present invention relates to a positioning apparatus, an exposure apparatus, and a device manufacturing method.

2. Description of the Related Art

The wafer stage mechanism and reticle stage mechanism of an exposure apparatus used in a lithography process to manufacture a semiconductor device are required to move the stages at a high acceleration speed and position them with high accuracy in order to improve productivity. Many exposure apparatuses therefore use coarse and fine moving stage mechanisms. A coarse and fine moving stage mechanism is configured such that a fine moving stage which is positioned with high positioning accuracy but moves with a small stroke is arranged on a coarse driving stage which is driven with a large stroke and large thrust but is positioned with low positioning accuracy.

Japanese Patent No. 4323759 discloses an arrangement in which a fine moving stage is mounted on a coarse moving stage which is driven in the X- and Y-axis directions within a horizontal plane by feedback control. A supporting unit supports the weight of the fine moving stage. The supporting unit includes a repulsion mover coupled to the fine moving stage and a repulsion stator coupled to the coarse moving stage.

Since the coarse moving stage is larger in size than the fine moving stage, it is difficult to increase the band of a feedback control system for controlling the position of the coarse moving stage. In addition, wirings and pipes mounted on the fine moving stage are received by the coarse moving stage and are then coupled to the outside. For this reason, the feedback control system of the coarse moving stage is externally disturbed by these wirings and pipes upon driving the coarse moving stage. Due to these reasons, the error of the coarse moving stage can be, for example, about 10 times that of the fine moving stage. The difference in error between the two stages will cause variations in the relative position between the repulsion stator and repulsion mover of the supporting unit. The variations in this relative position can be disturbances on control on the fine moving stage.

SUMMARY OF THE INVENTION

The present invention provides a technique advantageous to the improvement of positioning accuracy.

One of the aspects of the present invention provides a positioning apparatus comprising: a stage; a base; a supporting mechanism which is arranged between the stage and the base and supports the stage with a supporting portion having a spring characteristic; an actuator which is arranged between the stage and the base so as to drive the stage; and a controller which controls the actuator, wherein the controller controls the actuator so as to reduce a position error of the stage relative to a target position and cancel at least part of a force acting on the stage due to the spring characteristic of the supporting portion, based on the position error of the stage and a variation of a relative position between the stage and the base.

Further features of the present invention will become apparent from the following description of exemplary embodiments with reference to the attached drawings.

BRIEF DESCRIPTION OF THE DRAWINGS

FIG. 3 is a view showing the arrangement of a positioning apparatus according to the second embodiment of the present invention;

DESCRIPTION OF THE EMBODIMENTS

Figure 1:
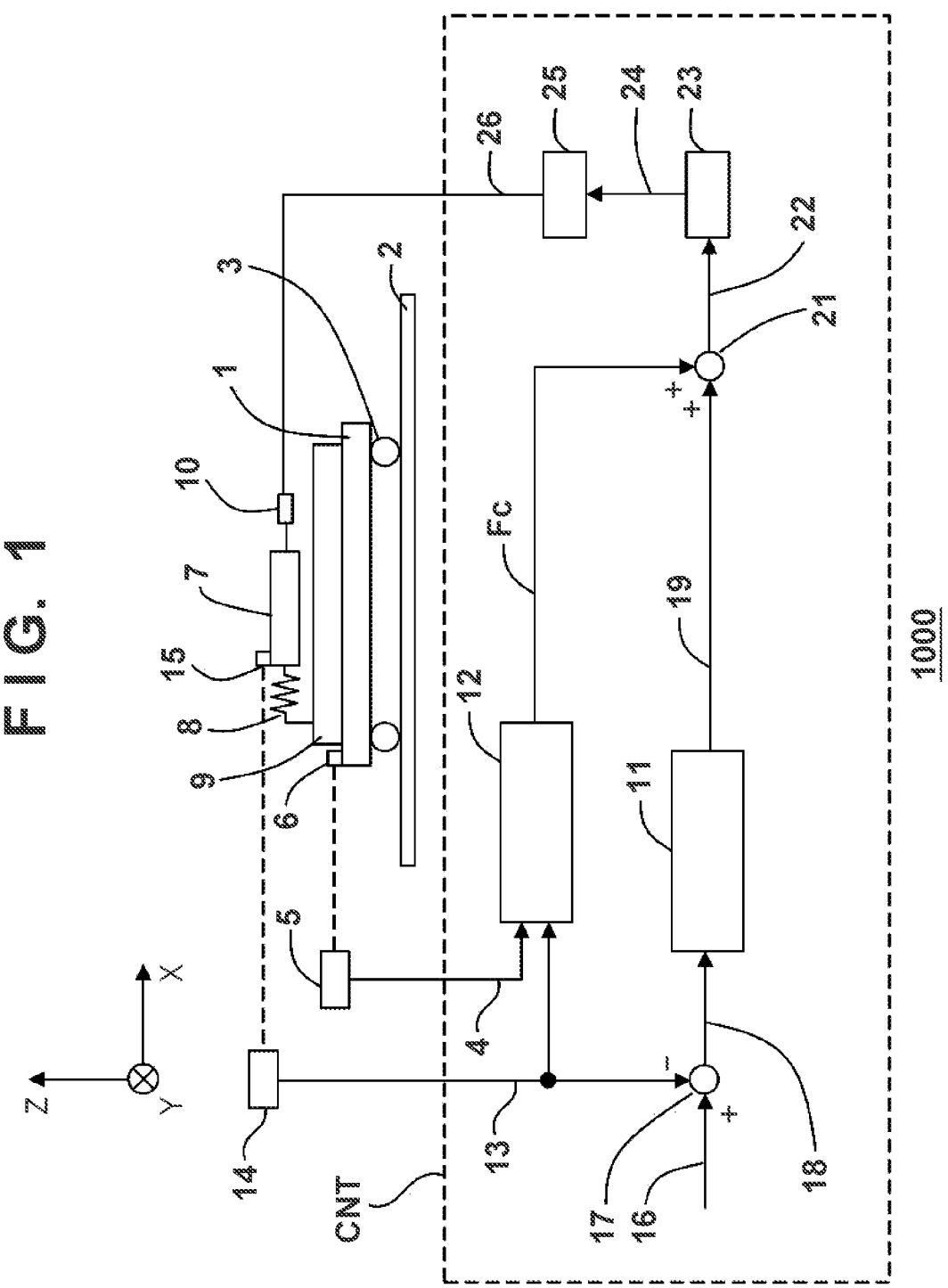
FIG. 1 is a view showing the arrangement of a positioning apparatus according to the first embodiment of the present invention.

A positioning apparatus 1000 according to the first embodiment of the present invention will be described with reference to FIG. 1. The positioning apparatus 1000 can be formed as at least one of an original stage mechanism and a substrate stage mechanism. The positioning apparatus 1000 can be configured to position, for example, a fine moving stage 7 in six degrees of freedom. For the sake of descriptive simplicity, an arrangement for positioning a coarse moving stage 1 and the fine moving stage 7 (corresponding to the stage in the appended claims) in the X-axis direction.

The coarse moving stage 1 is arranged on a stage base 2 through a coarse moving guide 3 such as a hydrostatic guide, and freely moves in the X-axis direction. A coarse moving laser interferometer 5 measures the position of the coarse moving stage 1 by using a coarse moving reflecting mirror 6 fixed to the coarse moving stage 1. The coarse moving laser interferometer 5 outputs the position measurement result on the coarse moving stage 1 as a coarse moving stage position measurement value 4. A feedback control system (not shown) controls the position of the coarse moving stage 1 by using the coarse moving stage position measurement value 4. A base 9 mounted on the coarse moving stage 1 supports the fine moving stage 7 from below through a supporting mechanism 8.

Figure 4A:
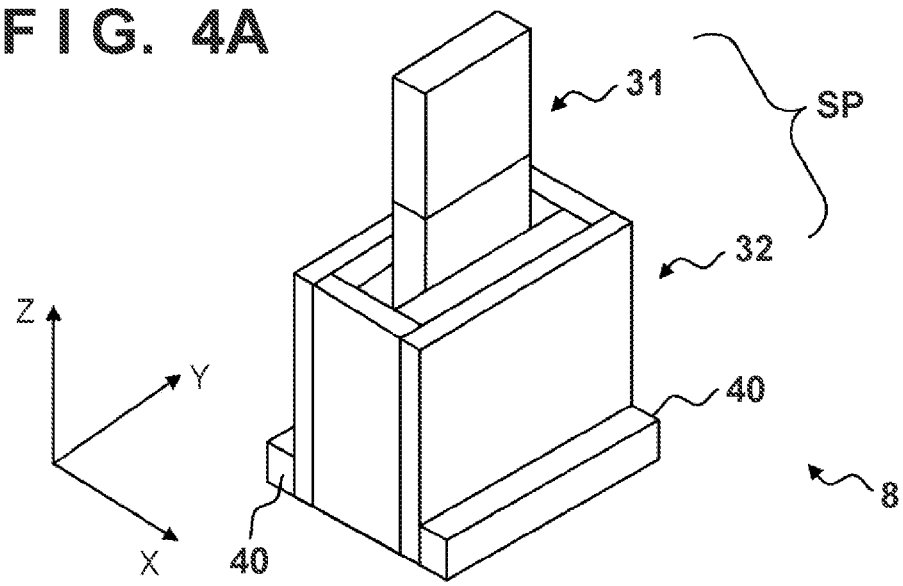
FIGS. 4A and 4B are perspective views exemplifying the arrangement of a supporting mechanism.
Figure 4B:
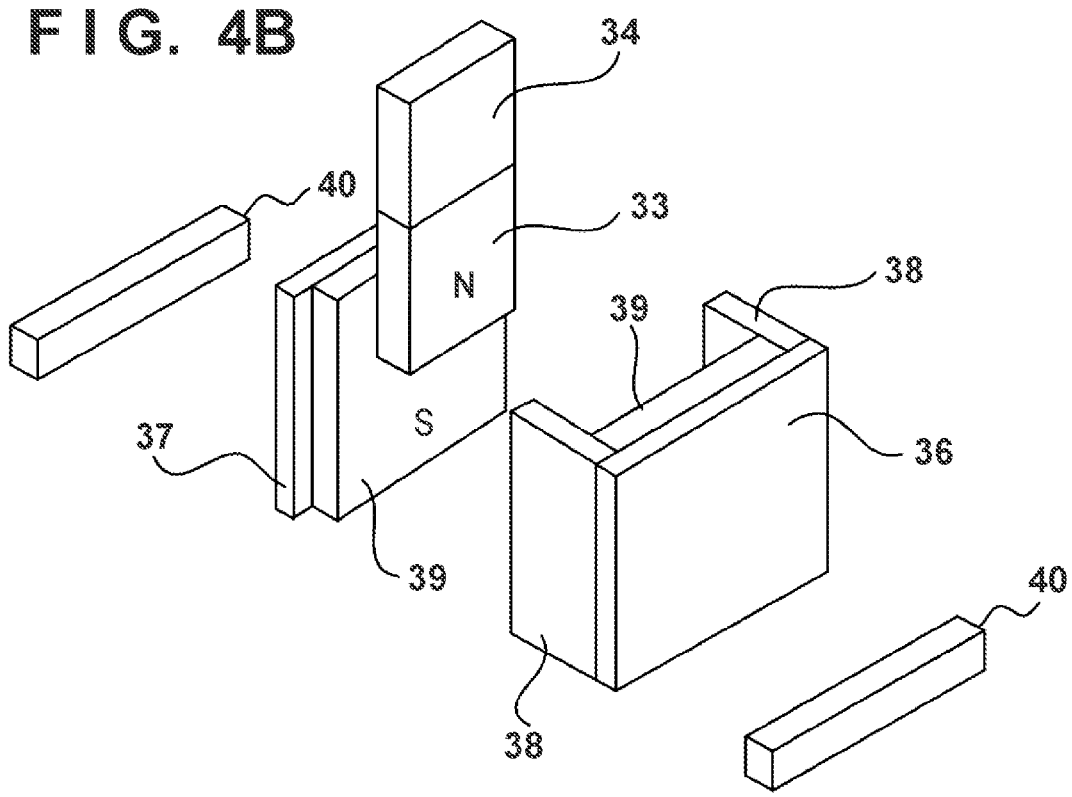

FIG. 4A exemplifies the supporting mechanism 8 in an assembled state. FIG. 4B exemplifies the supporting mechanism 8 in a disassembled state for the sake of descriptive convenience. The supporting mechanism 8 is arranged between the fine moving stage 7 and the base 9, and supports the fine moving stage 7 with a supporting portion SP having a spring characteristic. The supporting mechanism 8 typically supports the fine moving stage 7 from below.

The supporting portion SP can include a repulsion mover 31 fixed to the fine moving stage and a repulsion stator 32 fixed to the base 9 mounted on the coarse moving stage 1. The supporting mechanism 8 includes a fixing portion (not shown) which fixes the repulsion mover 31 to the fine moving stage 7 and a fixing portion 40 which fixes the repulsion stator 32 to the base 9. The repulsion mover 31 includes a repulsion movable magnet 33 and a repulsion movable magnet holder 34. The repulsion movable magnet 33 is a plate-shaped single pole permanent magnet and is magnetized in the thickness direction (X-axis direction). Referring to FIG. 4B, with regard to the magnetizing direction of the repulsion movable magnet 33, the positive direction of the X-axis corresponds to the N pole, and the negative direction of the X-axis corresponds to the S pole.

The repulsion stator 32 can include a front-side yoke 36, a rear-side yoke 37, two horizontal yokes 38, and two repulsion stationary magnets 39. The repulsion stationary magnets 39 are respectively fixed to the front-side yoke 36 and the rear-side yoke 37. The repulsion stationary magnets 39 are plate-shaped single pole permanent magnets and magnetized in the thickness direction (X-axis direction). In this case, the magnetizing direction of the two repulsion stationary magnets 39 is opposite to that of the repulsion movable magnet 33. That is, with regard to the magnetizing directions of the two repulsion stationary magnets 39, the positive direction of the X-axis corresponds to the S pole, and the negative direction of the X-axis corresponds to the N pole.

The front-side yoke 36, the rear-side yoke 37, and the horizontal yokes 38, serve to circulate magnetic fluxes of the repulsion stationary magnets 39, and can be formed from soft magnetic members such as iron members. Magnetic fluxes emerging from the rear side of the repulsion stationary magnet 39 fixed to the front-side yoke 36, that is, the N pole, enter the front side of the repulsion stationary magnet 39 fixed to the surface of the rear-side yoke 37, that is, the S pole. Magnetic fluxes emerging from the rear side of the repulsion stationary magnet 39, that is, the N pole, enter the rear-side yoke 37, diverge to the left and right (in the positive direction and negative direction of the Y-axis in this case), and enter the two horizontal yokes 38. Thereafter, the magnetic fluxes flow in the two horizontal yokes 38 in the positive direction of the X-axis toward the yoke center in the front-side yoke 36 and reach the N pole of the repulsion stationary magnet 39 on the rear surface of the front-side yoke 36.

The distance between the two repulsion stationary magnets 39 is set to be larger than the thickness of the repulsion movable magnet 33, and the repulsion movable magnet 33 is contractlessly inserted between the two repulsion stationary magnets 39. When the repulsion movable magnet 33 of the repulsion mover 31 is inserted between the two repulsion stationary magnets 39 of the repulsion stator 32, since the magnets having the same pole face each other, a repulsion force acts between the repulsion stationary magnet 39 and repulsion movable magnet 33 in the positive direction (upward direction) of the Z-axis. This repulsive force supports the fine moving stage 7.

Repulsive forces also act on the N pole side and S pole side of the repulsion movable magnet 33, respectively, in the X-axis direction. The repulsion movable magnet 33 and the two repulsion stationary magnets 39 are arranged symmetrically with respect to the X-axis direction. For this reason, when the repulsion movable magnet 33 is located at the middle position (reference position) between the two repulsion stationary magnets 39, no force acts on the repulsion movable magnet 33 along the X-axis direction. If, however, the position of the repulsion movable magnet 33 in the X-axis direction displaces from the middle position (reference position) between the two repulsion stationary magnets 39, a restoring force corresponding to the displacement amount acts on the repulsion movable magnet 33 in a direction to cancel the displacement in accordance with the displacement amount. That is, the supporting portion SP has a spring characteristic that cancels variations in the relative position between the repulsion mover 31 and the repulsion stator 32 in the X-axis direction. Note that the supporting mechanism 8 shown in FIGS. 4A and 4B is merely one arrangement example. The supporting mechanism 8 can have other various arrangements. For example, the supporting mechanism 8 can have the supporting portion SP formed from a coil spring or air spring.

The description will be continued with reference to FIG. 1 again. The positioning apparatus 1000 includes a linear motor (actuator) 10 which is arranged between the fine moving stage 7 and the base 9 to drive the fine moving stage 7 and a controller CNT which controls the linear motor 10. The linear motor 10 drives the fine moving stage 7 by applying a force between the fine moving stage 7 and the base 9. The controller CNT includes a feedback controller 11, a feedforward controller 12, a differentiator 17, and an adder 21. Typically, these components can be implemented by digital computers. A fine moving laser interferometer 14 provided on the same measurement standard member as that of the coarse moving laser interferometer 5 for measuring the position of the coarse moving stage 1 measures the position of the fine moving stage 7. In this case, the fine moving laser interferometer 14 measures the position of the fine moving stage 7 by using a fine moving reflecting mirror 15 fixed to the fine moving stage 7, and outputs a position measurement result on the fine moving stage 7 as a fine moving stage position measurement value 13. The differentiator 17 computes the difference between the fine moving stage position measurement value 13 and a position command value (target position) 16 associated with the x-axis direction of the fine moving stage 7, that is, a position error 18 associated with the X-axis direction. The feedback controller 11 determines a feedback control command value (first command value) 19 for reducing the position error 18 by, for example, PID computation.

As described above, the fine moving laser interferometer 14 and the coarse moving laser interferometer 5 which are fixed to the same measurement standard member measure the positions of the fine moving stage 7 and coarse moving stage 1. Therefore, subtracting the position of the coarse moving stage 1 from the position of the fine moving stage 7 can obtain the relative position between the fine moving stage 7 and the coarse moving stage 1. Subtracting the initial relative position (reference relative position) between the stages 7 and 1 at the time of servo initialization from this relative position can obtain the variation of the relative position. Since the base 9 is mounted on the coarse moving stage 1, this variation is equal to the displacement amount of the spring characteristic of the supporting portion SP of the supporting mechanism 8 in the X-axis direction. The supporting portion SP generates a restoring force corresponding to this displacement amount. This restoring force acts as a disturbance to the feedback control system for controlling the position of the fine moving stage 7. It is possible to calculate a disturbance to the fine moving stage 7 by multiplying this displacement amount by the modulus of rigidity (spring constant) of the spring characteristic of the supporting portion SP in the X-axis direction. The feedforward controller 12 generates a force command value for canceling at least part of the disturbance as a feedforward control command value (second command value) Fc. In this case, the feedforward controller 12 can determine the feedforward control command value Fc in accordance with equation (1):

$$Fc = K \cdot Xc \quad (1)$$

where K is the modulus of rigidity value (spring constant) of the spring characteristic of the supporting mechanism 8 (supporting portion SP) in the X-axis direction, and Xc is a displacement amount.

The adder 21 generates a fine-movement control command value 22 by adding the feedback control command value 19 and the feedforward control command value Fc. A DA converter 23 converts the fine-movement control command value 22 into a current command value 24 as an analog signal. A current driver 25 supplies a current 26 to the linear motor 10 in accordance with the current command value 24. The fine moving stage 7 is driven by a thrust based on the fine-movement control command value 22. This thrust can cancel at least part of the disturbance and position the fine moving stage 7 at high speed with high accuracy.

As described above, the controller CNT controls the linear motor 10 based on the position error of the fine moving stage 7 relative to the target position and the variation of the relative position between the fine moving stage 7 and the base 9. In this case, the controller CNT controls the linear motor 10 so as to reduce the error and cancel at least part of the force acting on the fine moving stage 7 due to the spring characteristic of the supporting portion SP.

It is possible to determine the modulus of rigidity of the supporting portion SP of the supporting mechanism 8 in the X-axis direction while the supporting mechanism 8 is mounted in the positioning apparatus 1000. The following will exemplify the method for this operation. First of all, the relative position between the coarse moving stage 1 and the fine moving stage 7 is set to a predetermined reference relative position. In this state, the feedback control system including the feedback controller 11 is initialized. The feedback control command value 19 in this state is then recorded. The relative position between the coarse moving stage 1 and the fine moving stage 7 is changed, and the stages are made to stand still. The feedback control command value 19 is recorded again. The chance amount of this relative position corresponds to a displacement amount Xc. Similar processing is performed while the value of Xc is gradually changed. The maximum value of the change amount of the relative position may be determined based on the maximum value of the variation of the relative position between the fine moving stage 7 and the coarse moving stage 1 at the time of normal operation of the positioning apparatus 1000. In this case, this apparatus may make the fine moving stage 7 and the coarse moving stage 1 stand still every time the relative position is changed, and may record the feedback control command value 19 at that time. Alternatively, the apparatus may record the feedback control command value 19 while continuously changing the relative position at very low speed. In this case, the speed of change may be set to a speed that makes no difference in the position error 18 of the fine moving stage 7 between when the fine moving stage 7 stands still and when the fine moving stage 7 moves at a very low speed.

Figure 2:
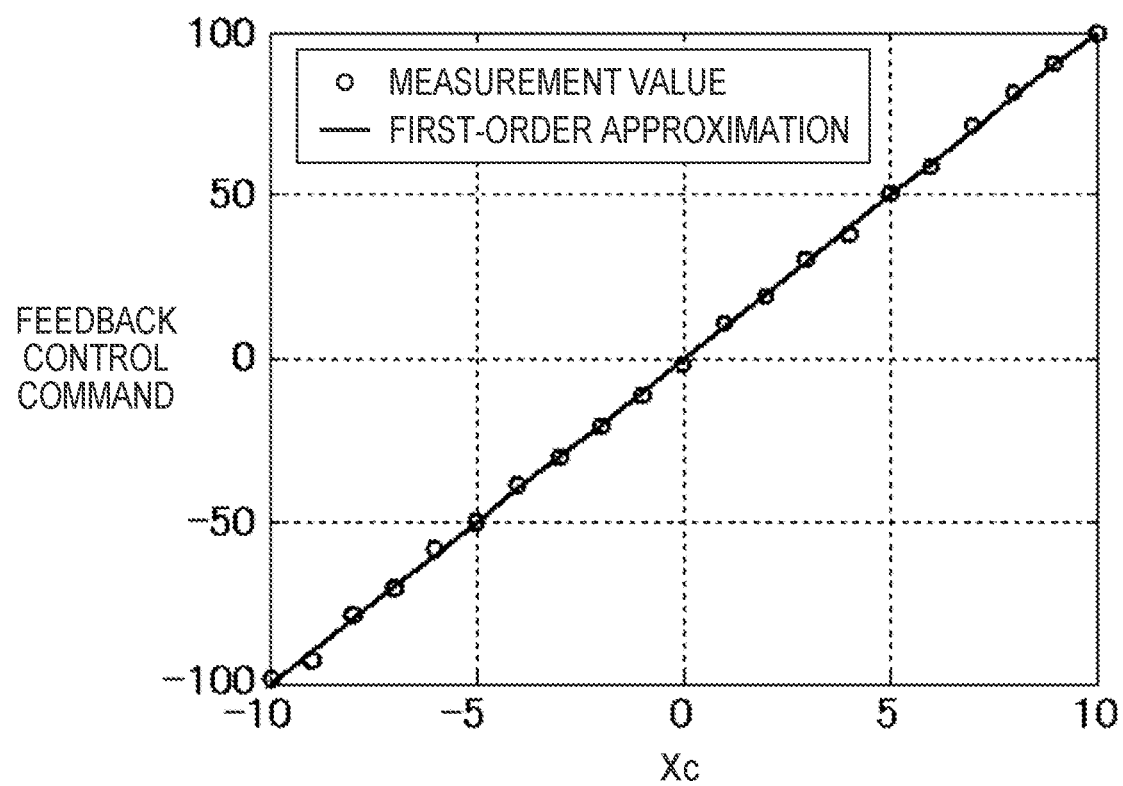
FIG. 2 is a graph exemplifying the relationship between variations and feedback command values.

FIG. 2 shows the result obtained by measuring the feedback control command value 19 while changing the displacement amount Xc, and the first-order approximation curve of the result. The gradient of the feedback control command value 19 relative to the displacement amount Xc has a positive sign. The feedback control command value 19 in a standing-still state is a force counteracting the disturbance. In contrast, the restoring force based on the spring characteristic of the supporting portion SP of the supporting mechanism 8 is a negative gradient relative to the displacement amount Xc. In the case shown in FIG. 2, the feedback control command value 19 can be approximated by a first-order line relative to the displacement amount Xc, and the gradient of the line represents a modulus of rigidity K.

If a large error is caused by linear function approximation, it is possible to use high-order function approximation. Alternatively, it is possible to determine a modulus of rigidity by referring to a numerical value table using the displacement amount Xc as an argument.

Although positioning in the X-axis direction has been described for the sake of descriptive simplicity, the above control in the X-axis direction can be applied to control in the Y-axis direction.

The above embodiment obtains the displacement amount of the spring characteristic of the supporting portion SP of the supporting mechanism 8 in the X-axis direction from the difference in position measurement value between the coarse moving stage 1 and the fine moving stage 7. However, it is possible to use an output from a gap sensor provided to directly measure the distance between the fine moving stage 7 and the base 9.

A positioning apparatus 1001 according to the second embodiment of the present invention will be described with reference to FIG. 3. Those not specifically referred to in the second embodiment can follow the first embodiment. In the second embodiment, the apparatus generates a fine-movement control command value 22 by adding an acceleration feedforward control command value 101 to a feedback control command value 19 in addition to a feedforward control command value Fc. This can reduce a position error 18 at the time of acceleration/deceleration of a fine moving stage 7 and a coarse moving stage 1. The acceleration feedforward control command value 101 is a command value obtained by causing an adder 105 to add an acceleration command value 102 linked to a position command value 16 and a correction control command value 103 obtained by phase lead compensation of the acceleration command value 102. The apparatus generates the correction control command value 103 by causing a phase lead compensator 104 to process the acceleration command value 102. The phase lead compensator 104 can be configured to calculate the first-order differential value and second-order differential value of the acceleration command value 102 and output, as the correction control command value 103, the result obtained by multiplying the respective differential values by adjustment gains. The correction control command value 103 is used to cope with a lag of the acceleration command value 102 due to the sampling time in a digital computer and the response lag of a current driver 25. Although higher-order differential terms may be used, since the accuracy degrades due to the influences of the discretization and quantization of the digital computer, it is preferable to use up to a second-order differential value. As a result of this phase lead compensation, the lag of the acceleration/deceleration force output from a linear motor 10 decreases relative to the acceleration command value 102.

A feedforward controller 12 suppresses the influence of disturbance due to the spring characteristic of a supporting portion SP of a supporting mechanism 8. Therefore, the transfer function from the force generated by the linear motor 10 which drives the fine moving stage 7 to the position of the fine moving stage 7 (fine moving stage position measurement value) has a simple form of $1/(Ms^2)$ (where M is the mass of the fine moving stage, and s is a Laplace operator). Outputting an acceleration/deceleration force based on the acceleration command value 102 from the linear motor 10 by feedforward control will greatly reduce the position error at the time of acceleration/deceleration. A scan exposure apparatus which exposes a substrate while a stage is moved at constant speed is the mainstream of exposure apparatuses. In order to improve the productivity, it is important to shorten the settling time from the instant the stage is accelerated to reach a constant speed to the instant the error amplitude is settled to a value that allows exposure. The positioning apparatus 1001 according to the second embodiment can greatly reduce the position error at the time of acceleration, and hence is advantageous in exposing the substrate at the same time when the speed of the stage becomes constant. In contrast to this, in an arrangement without the feedforward controller 12, the above transfer function does not have a simple form like $1/(Ms^2)$ due to the influences of the spring characteristic of the supporting mechanism 8 and the coarse moving stage 1. It is difficult to reduce the position error by using the acceleration command value 102 at the time of acceleration.

In the first and second embodiments, the actuator which drives the fine moving stage 7 is not limited to the linear motor 10. For example, if the generation of heat by the linear motor 10 poses a problem when the acceleration is high, an electromagnet for acceleration/deceleration may be added.

Figure 5:
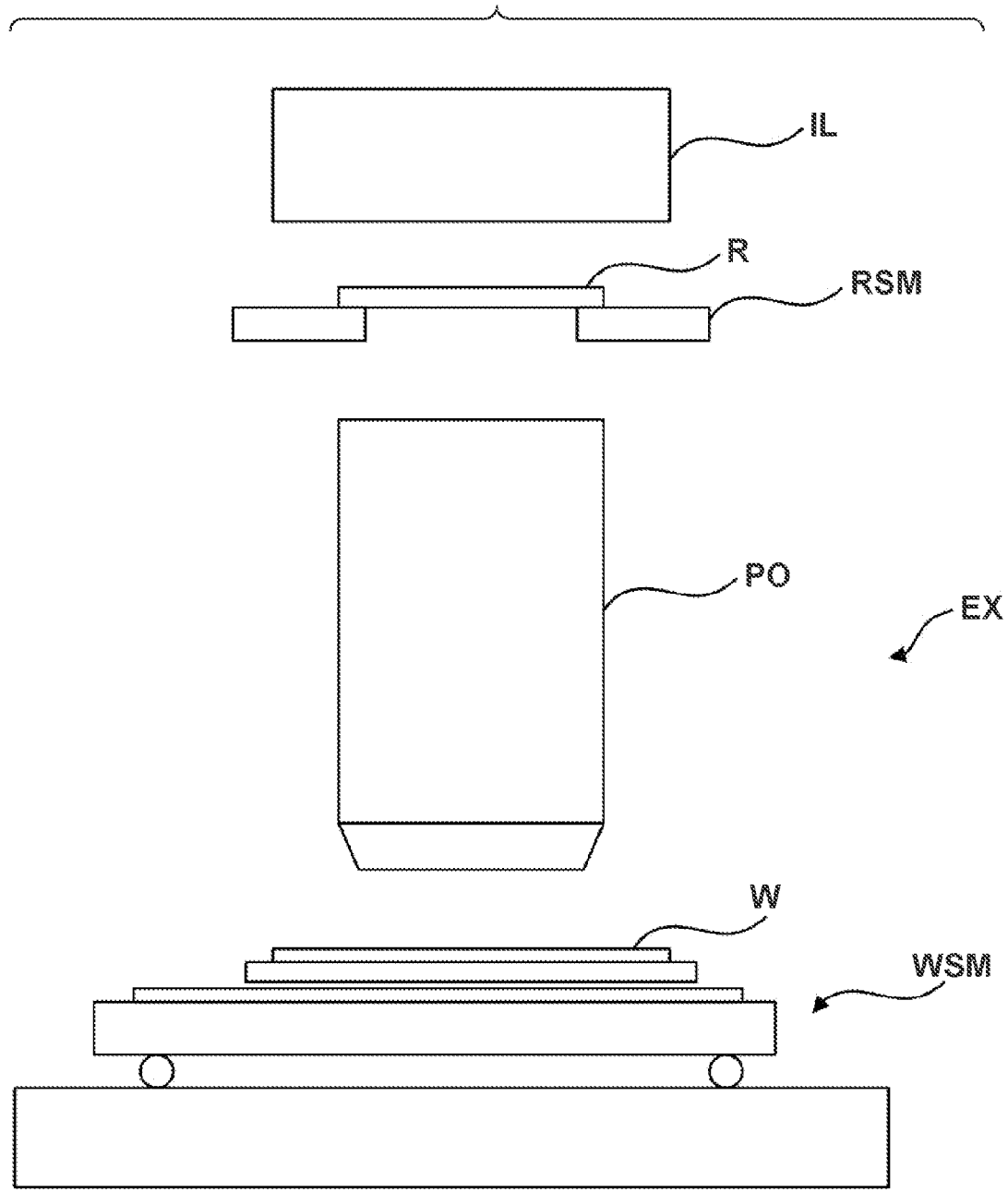
FIG. 5 is a view showing the arrangement of an exposure apparatus according to an embodiment of the present invention.

An exposure apparatus EX including the positioning apparatus of the present invention, which has been exemplified in the first and second embodiments, will be described next with reference to FIG. 5. The exposure apparatus EX is configured to transfer a pattern of an original R onto a substrate W. The exposure apparatus EX can include an original positioning mechanism RSM which positions the original R, an illumination system IL which illuminates the original R, a substrate positioning mechanism WSM which positions the substrate W, and a projection optical system OP which projects the pattern of the original R onto the substrate. At least one of the original positioning mechanism RSM and the substrate positioning mechanism WSM can include a positioning apparatus represented by the positioning apparatus 1000 or 1001 described above.

A device manufacturing method according to an embodiment of the present invention will be described next. A device can be, for example, a semiconductor device. A semiconductor device is manufactured by the pre-step of forming an integrated circuit on a wafer (semiconductor substrate) and the post-step of completing the integrated circuit chip formed in the pre-step. The pre-step can include the step of transferring the pattern of an original onto the substrate coated with a photosensitive agent by using the above exposure apparatus EX and the step of developing the substrate. The post-step can include an assembly step (dicing and boding) and a packaging step (encapsulation).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-123584, filed Jun. 1, 2011, which is hereby incorporated by reference herein in its entirety.

What is claimed is:

1. A positioning apparatus comprising:
a stage;
a base;
a supporting mechanism, having a supporting portion with a spring characteristic supporting the stage, arranged between the stage and the base;
an actuator that drives the stage arranged between the stage and the base; and
a controller that controls the actuator by a command value including a sum of (a) a first command value for controlling the actuator to reduce a position error of the stage relative to a target position and (b) a second command value for controlling the actuator to cancel at least part of a force acting on the stage, due to the spring characteristic of the supporting portion, in accordance with a variation of a relative position between the stage and the base, and
wherein the controller obtains the second command value by multiplying the variation by a modulus of rigidity of the spring characteristic.

2. The apparatus according to claim 1, wherein the controller controls the actuator based on an acceleration command value for the stage in addition to the position error and the variation.

3. The apparatus according to claim 1, wherein the supporting portion supports the stage by a repulsive force acting between permanent magnets.

4. The apparatus according to claim 1, further comprising:
a coarse moving stage,
wherein the base is mounted on the coarse moving stage.

5. An apparatus for transferring a pattern of an original onto a substrate, the apparatus comprising:
an original positioning mechanism that positions the original; and
a substrate positioning mechanism that positions the substrate,
wherein at least one of the original positioning mechanism or the substrate positioning mechanism comprises:
a stage;
a base;
a supporting mechanism, having a supporting portion with a spring characteristic supporting the stage, arranged between the stage and the base;
an actuator that drives the stage arranged between the stage and the base; and
a controller that controls the actuator by a command value including a sum of (a) a first command value for controlling the actuator to reduce a position error of the stage relative to a target position and (b) a second command value for controlling the actuator to cancel at least part of a force acting on the stage, due to the spring characteristic of the supporting portion, in accordance with a variation of a relative position between the stage and the base, and
wherein the controller obtains the second command value by multiplying the variation by a modulus of rigidity of the spring characteristic.

6. A device manufacturing method comprising the steps of:
transferring a pattern of an original onto a substrate using an apparatus; and
developing the substrate,
wherein the apparatus is configured to transfer a pattern of an original onto the substrate, and comprises:
an original positioning mechanism that positions the original;
a substrate positioning mechanism that positions the substrate,
wherein at least one of the original positioning mechanism or the substrate positioning mechanism comprises:
a stage;
a base;
a supporting mechanism, having a supporting portion with a spring characteristic supporting the stage, arranged between the stage and the base;
an actuator that drives the stage arranged between the stage and the base; and
a controller that controls the actuator by a command value including a sum of (a) a first command value for controlling the actuator to reduce a position error of the stage relative to a target position and (b) a second command value for controlling the actuator to cancel at least part of a force acting on the stage, due to the spring characteristic of the supporting portion, in accordance with a variation of a relative position between the stage and the base, and
wherein the controller obtains the second command value by multiplying the variation by a modulus of rigidity of the spring characteristic.

* * * * *